US005543728A

United States Patent [19]
Grace et al.

[11] Patent Number: 5,543,728
[45] Date of Patent: Aug. 6, 1996

[54] LOW LEAKAGE DIODE SWITCHES FOR A TESTER CIRCUIT FOR INTEGRATED CIRCUITS

[76] Inventors: James W. Grace, 13355 La Cresta Dr., Los Altos Hills, Calif. 94022; David M. DiPietro, 1423 Woodgrove Sq., San Jose, Calif. 95117

[21] Appl. No.: 77,186

[22] Filed: Jun. 15, 1993

[51] Int. Cl.⁶ .................................................. G01R 13/00
[52] U.S. Cl. ..................................... 324/763; 324/158.1
[58] Field of Search .......................... 324/158 R, 158 F, 324/73.1, 158.5, 763, 767, 765, 754; 371/15.1, 22.1, 22.2, 22.5, 22.6; 437/8; 257/48, 40

[56] References Cited

U.S. PATENT DOCUMENTS 3,585,500  6/1971  Grubel ................................ 324/158 R
5,103,169  4/1992  Heaton et al. ...................... 324/158 R

*Primary Examiner*—Vinh P. Nguyen

[57] ABSTRACT

Pin electronics for an IC tester are built as an integrated circuit for testing the electrical operation of a device under test (DUT) by applying a test voltage to each of the pins on the DUT and measuring each resulting current. The tester uses diode switches instead of discrete relays to switch between measurement ranges. Leakage current, on the order of nanoamperes from a switch that is open or disabled, is dramatically reduced by reverse biasing the diodes in each diode switch about the switch's diode bridge output node by an equal amount so that the summed current at the output node is almost zero.

4 Claims, 22 Drawing Sheets

LOW LEAKAGE DIODE SWITCHES FOR A TESTER CIRCUIT FOR INTEGRATED CIRCUITS

BACKGROUND AND SUMMARY OF THE INVENTION

An integrated circuit (IC) tester characterizes the electrical operation of a device under test (DUT) by applying a test voltage to each of the pins on the DUT and measuring each resulting current. Typically, an IC tester selects one of several measure resistors, applies a stimulus to a pin of the DUT using an input driver, and measures the current response of the DUT through the related measure resistor. Each measure resistor corresponds to a specific current range and measurement accuracy is proportional to the precision of the selected resistor.

Currently available IC testers, such as the A580 Series by Teradyne, Inc. and the Synchromaster HPC by LTX Corporation, typically contain discrete electrical elements (including discrete measure resistors and discrete relays for switching between the measure resistors) mounted on printed circuit boards and require 3 boards for every 8 DUT pins. The maximum allowable number of pins of the DUT is limited by the number of boards that may be positioned near the DUT. Furthermore, discrete elements tend to be either expensive or of relatively slow performance. Incorporating the functionality of many discrete elements into a few IC components, which may subsequently be mounted on a single printed circuit board, would increase the maximum allowable number of pins of the DUT, would reduce the number of discrete measure resistors required, and would improve the overall performance of the IC tester by using integrated circuitry.

In accordance with an illustrated preferred embodiment of the present invention, an IC tester uses diffusion resistors instead of discrete resistors for the measure resistors. Diffusion resistors possess non-ideal characteristics, such as non-linear resistance with voltage bias conditions and inaccuracy of resistor values. To minimize the non-linear characteristics, each measure resistor contains precision integrated resistors fabricated on a unitary substrate as a dual path device. The dual paths, biasing and measuring, provide a means for calibrating the precision of each diffusion resistor. The biasing path contains two split diffusion resistors of equal impedance in series while the measuring path is a single diffusion resistor having uniform resistivity. The mid-points of each path and the shared island tub are set to the same potential. Thus, a Taylor series expansion for a curved line is applied to the two endpoints of the measuring path resulting in a diffusion resistor having improved linearity. These precision integrated resistors when used with design techniques such as matching characteristics, thermal layout, leakage cancellation schemes, and linearization of the resistors produces a precision current measuring system operable over a wide range of conditions. Leakage current is reduced from the nanoAmpere (nA) range to the picoAmpere (pA) range since the mid-points and the island tub are at zero potential with respect to one another, thereby making the resistance of the measure resistors more precise.

In accordance with another illustrated preferred embodiment of the present invention, an IC tester uses diode switches instead of discrete relays to switch between the measure resistors. Leakage current, on the order of nanoamperes from a switch that is open or disabled, is dramatically reduced by reverse biasing the diodes in each diode switch about the switch's diode bridge output node by an equal amount so that the summed current at the output node is almost zero.

In accordance with another illustrated preferred embodiment of the present invention, an IC tester includes voltage spike suppression to minimize the effects on the DUT of voltage spikes caused by the fast response of the diode switches as the IC tester steps through the current measurement ranges. This voltage spike may be large enough to jeopardize the sensitive circuitry on the DUT itself. A spike suppression switch in the negative feedback path of the input driver overrides the feedback circuit during switching to reduce the spike to a safer level.

BRIEF DESCRIPTION OF THE DRAWINGS

FIG. 6A shows the interconnection of one of the resistor ranges used in the resistor array depicted in FIG. 5. FIG. 6B shows the interconnection of each device used in the resistor array depicted in FIG. 5.

FIG. 9A illustrates a prior art diffusion resistor used as a measurement resistor. FIG. 9B shows a physical cross-sectional view of a prior art diffusion resistor along line A—A' of FIG. 9A. FIG. 9C shows parasitic leakage paths in the prior art diffusion resistor depicted in FIG. 9B. FIG. 9D is an electrical model of the parasitic leakage paths shown in FIG. 9C.

DETAILED DESCRIPTION OF THE PREFERRED EMBODIMENTS

Figure 1:
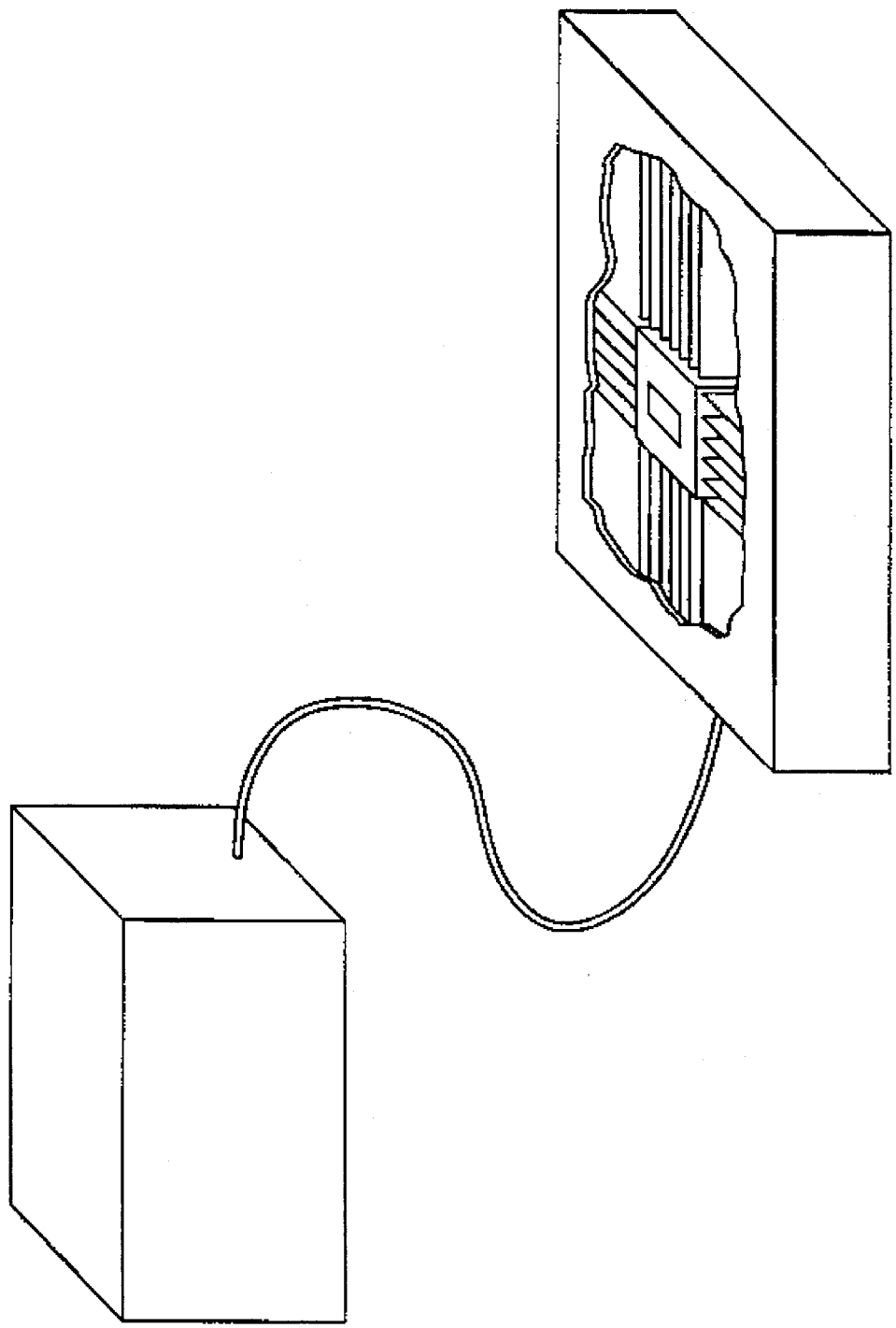
FIG. 1 shows a prior art IC tester.

FIG. 1 shows a DUT in an IC tester of the prior art. The prior art tester contains a tester console, test head, pin electronic boards, test card and DUT. The maximum allowable number of pins of the DUT which may be tested is limited by the number of boards that may be positioned near the DUT.

Figure 2:
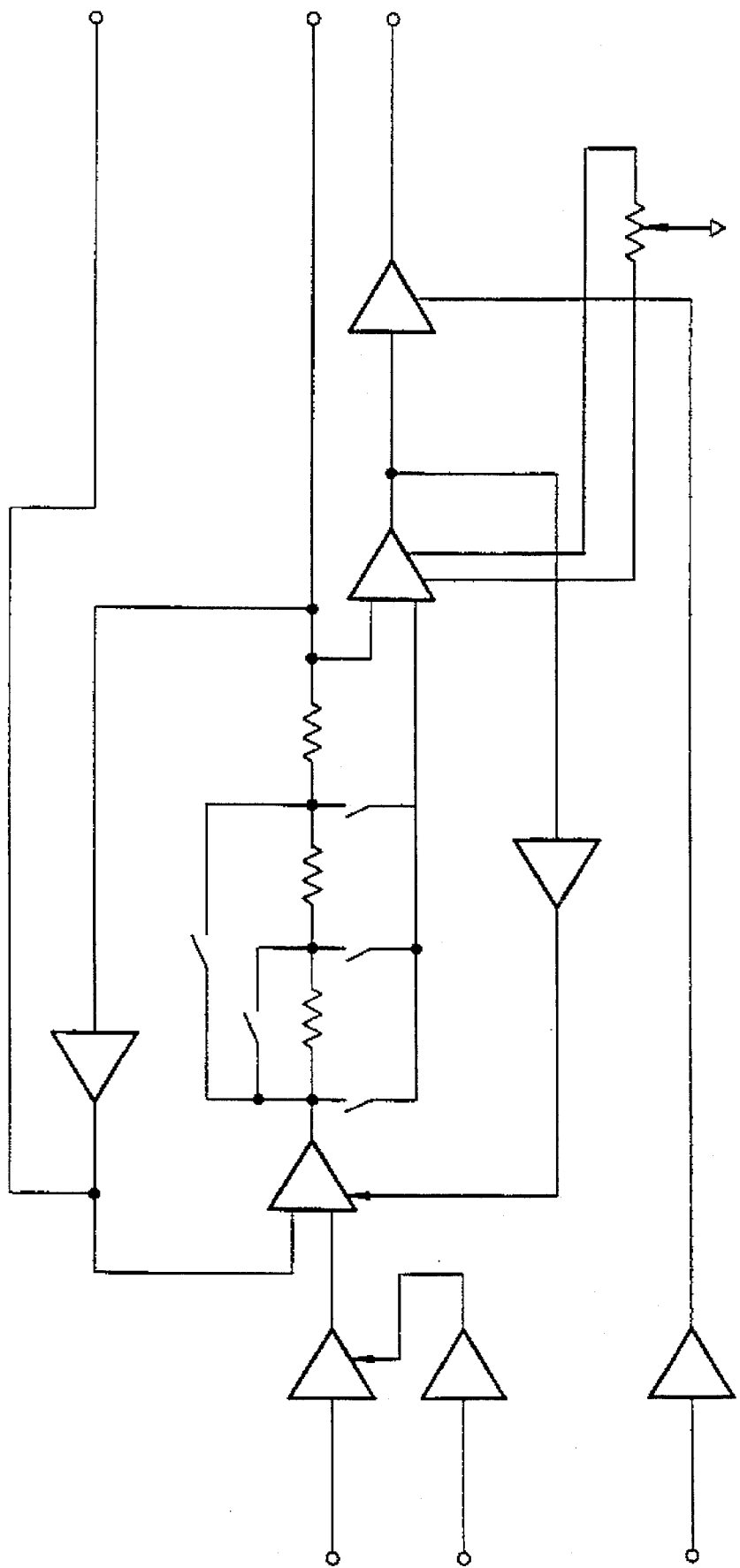
FIG. 2 shows a test circuit for measuring current used in the prior art IC tester shown in FIG. 1.

FIG. 2 is a simplified schematic diagram of a channel for a board in the prior art tester shown in FIG. 1.

Figure 3:
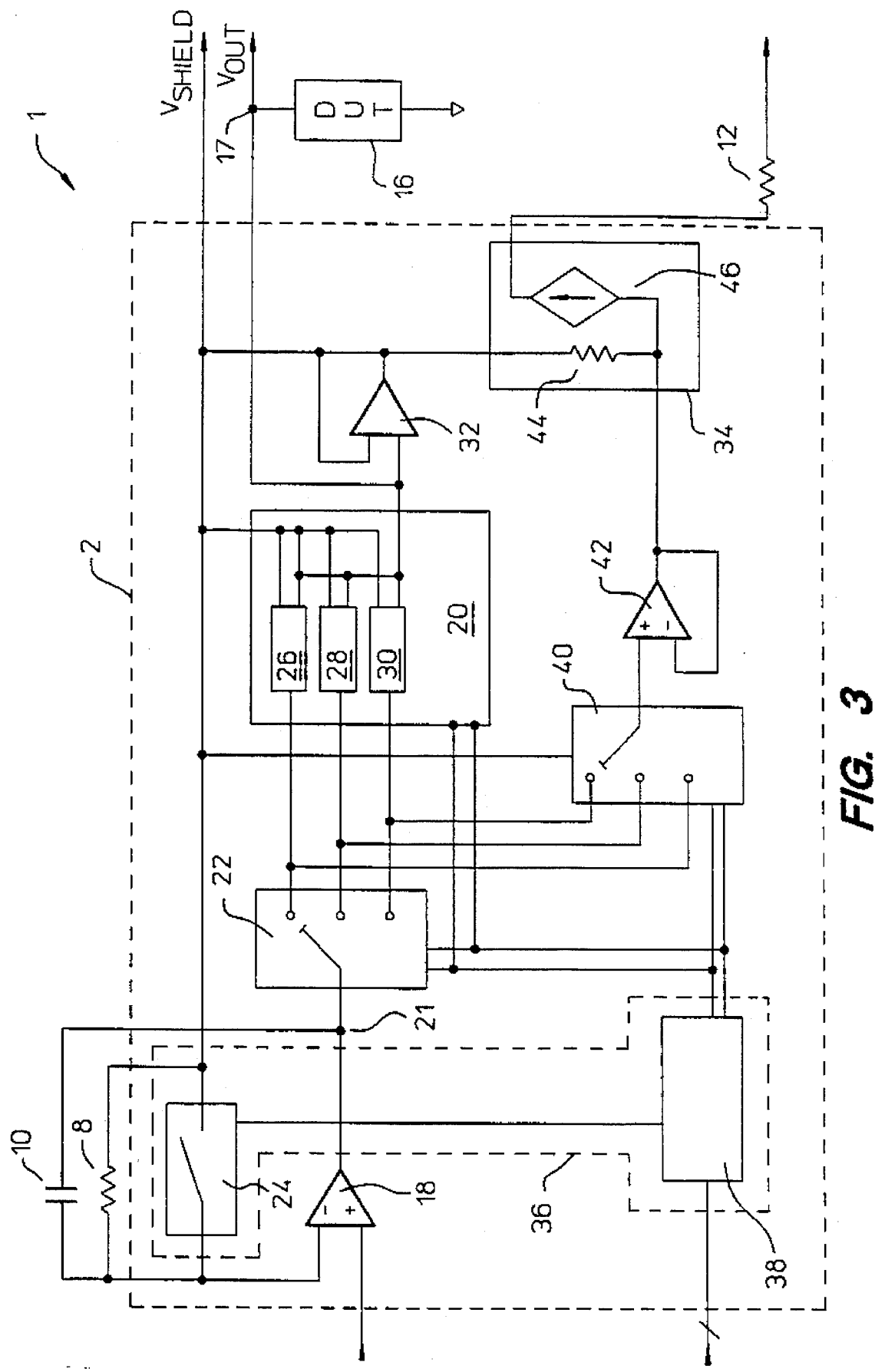
FIG. 3 shows a functional block diagram of an IC test circuit that is constructed in accordance with a preferred embodiment of the present invention.

FIG. 3 shows a functional block diagram of an IC test circuit 1 that is constructed in accordance with a preferred embodiment of the present invention. The IC test circuit 1 is implemented as an IC 2 and external components 8, 10, 12. An input voltage on the positive input of driver 18 results in an applied test voltage on a pin 17 of DUT 16 and producing an unknown current, $I_{unk}$, in a resistor array 20. The input voltage swings between −2.5 and +7 volts, inclusively. The driver 18 compensates at full scale for a voltage drop of 1 volt across resistor array 20 such that the input and test voltages are equal. Resistor array 20 contains several current measurement ranges 26, 28, 30. The output of the driver 18 connects to the input 21 of pass-through switch 22. The pass-through switch 22 performs a three position-single pole function. A spike suppression switch 24 in the negative feedback path of the driver 18 suppresses voltage spikes on the DUT 16 when the IC tester switches between the measurement ranges 26, 28, 30. The IC 2 measures the current through the measurement ranges 26, 28, 30 generated in response to the applied test voltage.

Resistor array 20 contains three current measurement ranges 26, 28, 30, each having an associated scale factor. Each measurement range 26, 28, 30 contains precision integrated resistors in series. Each current measurement range 26, 28, 30 may be connected to the output of the driver 18 by the pass-through switch 22. Pass-through switch 22 may be implemented as a switch for each of the measurement ranges 26, 28, 30. The three current measurement ranges 26, 28, 30 are electrically connected to one another producing output signal, $V_{out}$. $V_{out}$ sets the voltage on positive input of a unity buffer amplifier 32. The negative input and the output of the buffer amplifier 32 are electrically connected together to produce $V_{shield}$ which provides biasing for biasing resistors, which will be described later. The output of the buffer amplifier 32 also enters current measuring section 34.

In an enabling section 36, control section 38 receives external control signals. In response to the signals, control section 38 simultaneously enables pass-through switch 22 selecting one of the current measurement ranges 26, 28, 30 and disables the unused measurement ranges 26, 28, 30. Control section 38 further enables impedance switch 40. Impedance switch 40 performs a three position-single position. Impedance switch 40 is connected to the positive input of a driving amplifier 42 and resistor array 20. The output and the negative input of the impedance driving amplifier 42 are connected together to have the same voltage as on input 21 of pass-through switch 22. This voltage level is then passed to the current measuring section 34.

Control section 38 also connects to spike suppression switch 24. When a new measurement range 26, 28, 30 is selected, voltage spikes may occur on pin 17 of the DUT 16. These spikes can damage the sensitive circuitry of the DUT 16. During the selection of the new measurement range 26, 28, 30, control section 38 closes suppression switch 24 and operates pass-through switch 22. Thus, the voltage spike is reduced to a safer level that will not damage the DUT 16.

Functionally, control section 38 determines which measurement range 26, 28, 30 is selected. Input driver 18 applies a stimulus to pin 17 of DUT 16 which generates a current response by the DUT 16. The current response is identical to the current, $I_{UNK}$, flowing in the selected measurement range 26, 28, 30. Since the resistance within the selected measurement range 26, 28, 30 is known, $I_{UNK}$ may be determined from a voltage reading across the measurement range 26, 28, 30 and scaling the reading by the associated scaling factor.

The accuracy of the current reading is improved by using current measuring section 34 to isolate current readings from stimulation of DUT 16. In this simplified electrical model of the current measuring section 34, the voltage drop across resistor array 20 is impressed across a mirror resistor 44 producing a scaled current, $I_M$. The scaled current, $I_M$, is then mirrored by a voltage dependent current source (VDCS) 46. The current reading is subsequently analyzed. The mirror resistor 44 is a precision integrated resistor.

Figure 4:
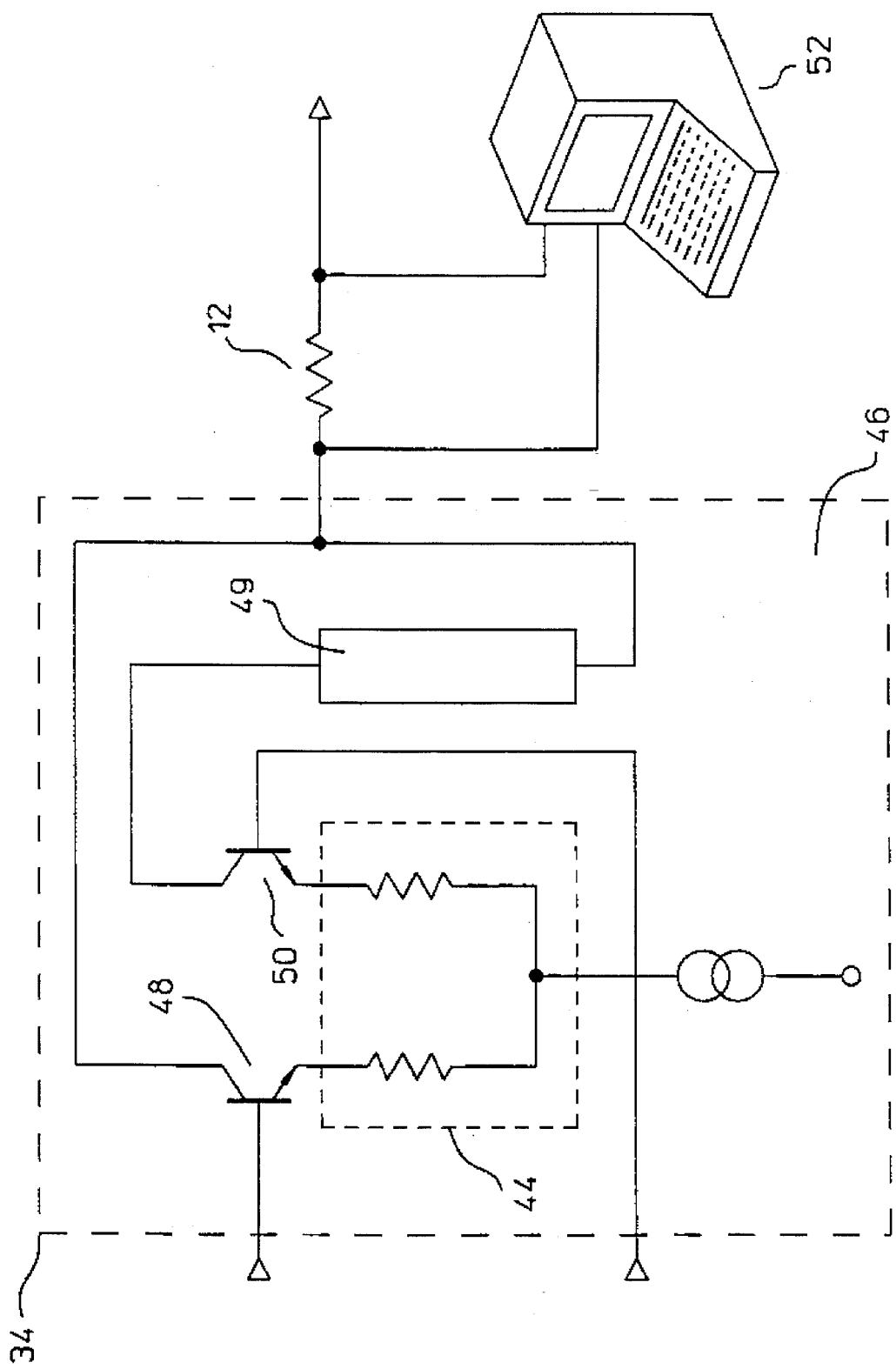
FIG. 4 is a simplified electrical model of the transconductance amplifier shown in FIG. 3.

FIG. 4 shows an electrical model of the current measuring section 34 depicted in FIG. 3. The voltage drop across the selected current measurement range 26, 28, 30 is impressed across mirror resistor 44. The VDCS 46 is composed of a differential amplifier in which emitters of transistors 48, 50 are in common mode operation. Transistors 48, 50 draw power from a current source within the VDCS 46. The differential collector currents of the transistors 48, 50 are electrically connected to one another through a current inverter 49 so that their difference is the scaled current, $I_M$. The scaled current, $I_M$, is proportional to the unknown current, $I_{UNK}$, passing through the selected measurement range 26, 28, 30. $I_M$ is then converted to a voltage using discrete precision resistors and then analyzed by a computer 52. Computer 52 scales the voltage reading by the associated scaling factor of the selected measurement range 26, 28, 30. The scaled voltage reading reflects the actual current flowing through pin 17 of DUT 16.

Figure 5:
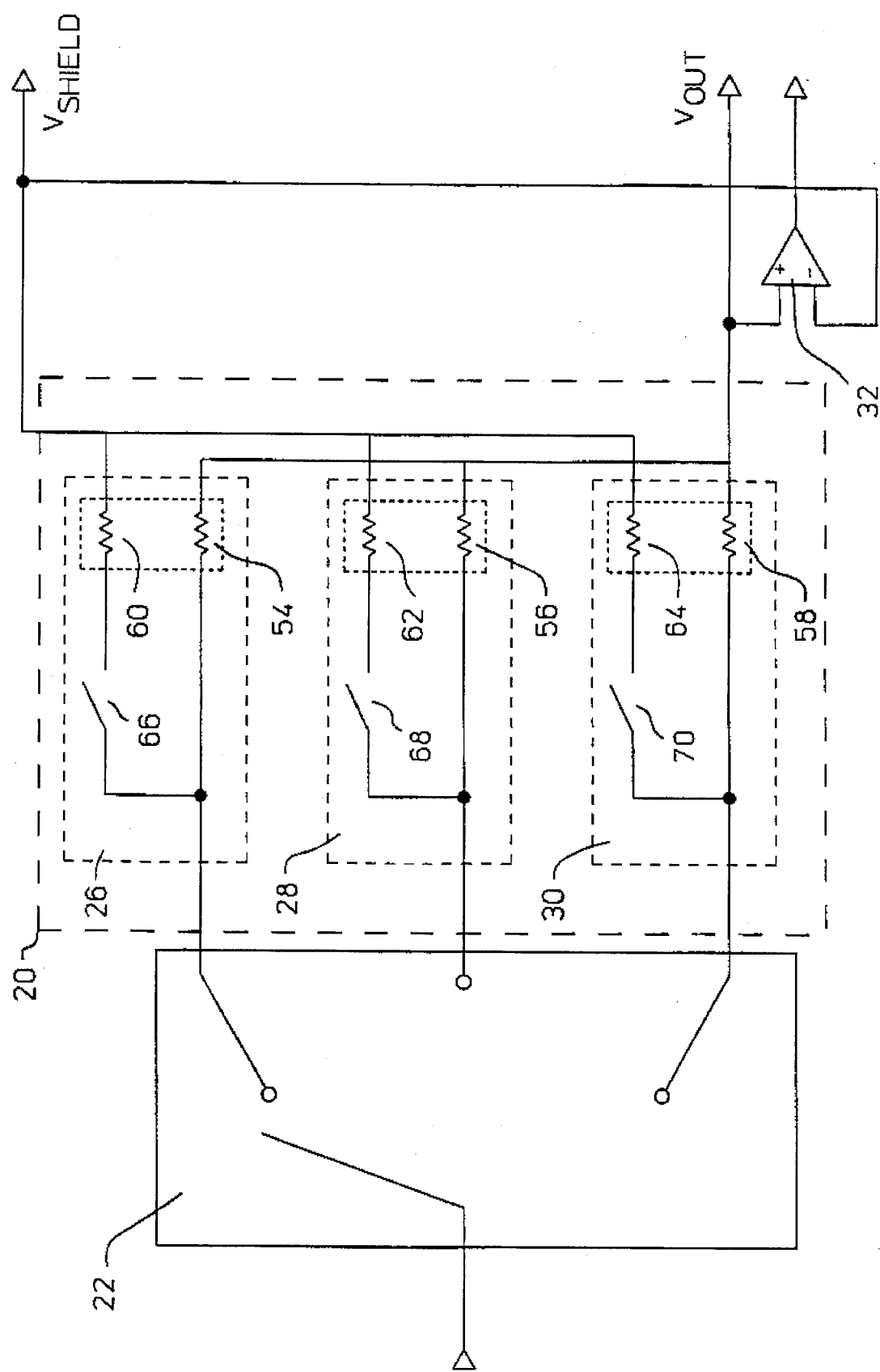
FIG. 5 is a simplified electrical model of the resistor array shown in FIG. 3.

FIG. 5 shows a simplified electrical model of the resistor array 20 shown in FIG. 3. Switch 22 is connected to one of the current measurement ranges 26, 28, 30. Each range contains a measuring element 54, 56, 58, a biasing element 60, 62, 64 and a low leakage diode switch 66, 68, 70. The low leakage diode switch 66, 68, 70 and the biasing element 60, 62, 64 are in series. The biasing elements 60, 62, 64 are electrically connected to the output of buffer 32, $V_{shield}$. The measurement elements 54, 56, 58 are electrically connected together producing $V_{out}$ and subsequently connected to the positive input of the buffer amplifier 32.

Figure 6B:
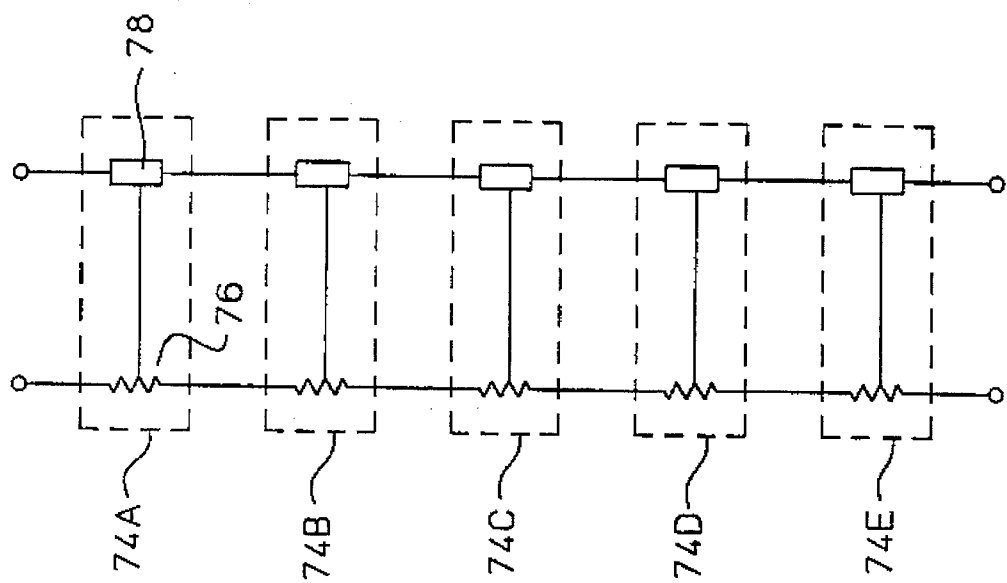
FIGS. 6A–B are schematic diagrams.
Figure 6A:
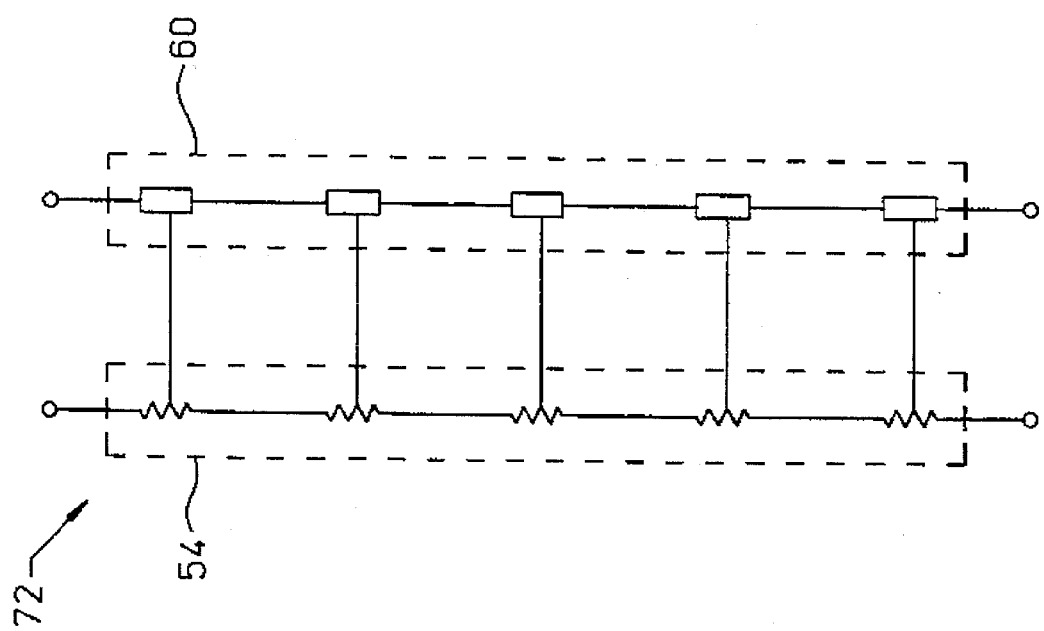

FIGS. 6A–B are schematic diagrams showing one of the measurement ranges 26, 28, 30 used in the resistor array 20 shown in FIG. 5. FIG. 6A illustrates the dual resistance paths 54, 60. FIG. 6B shows a precision integrated resistor 74A (resistors 74A–E are identical) used in the resistor range 26, 28, 30. Each precision integrated resistor 74A contains a measurement resistor 76 and a biasing resistor 78.

Figure 7:
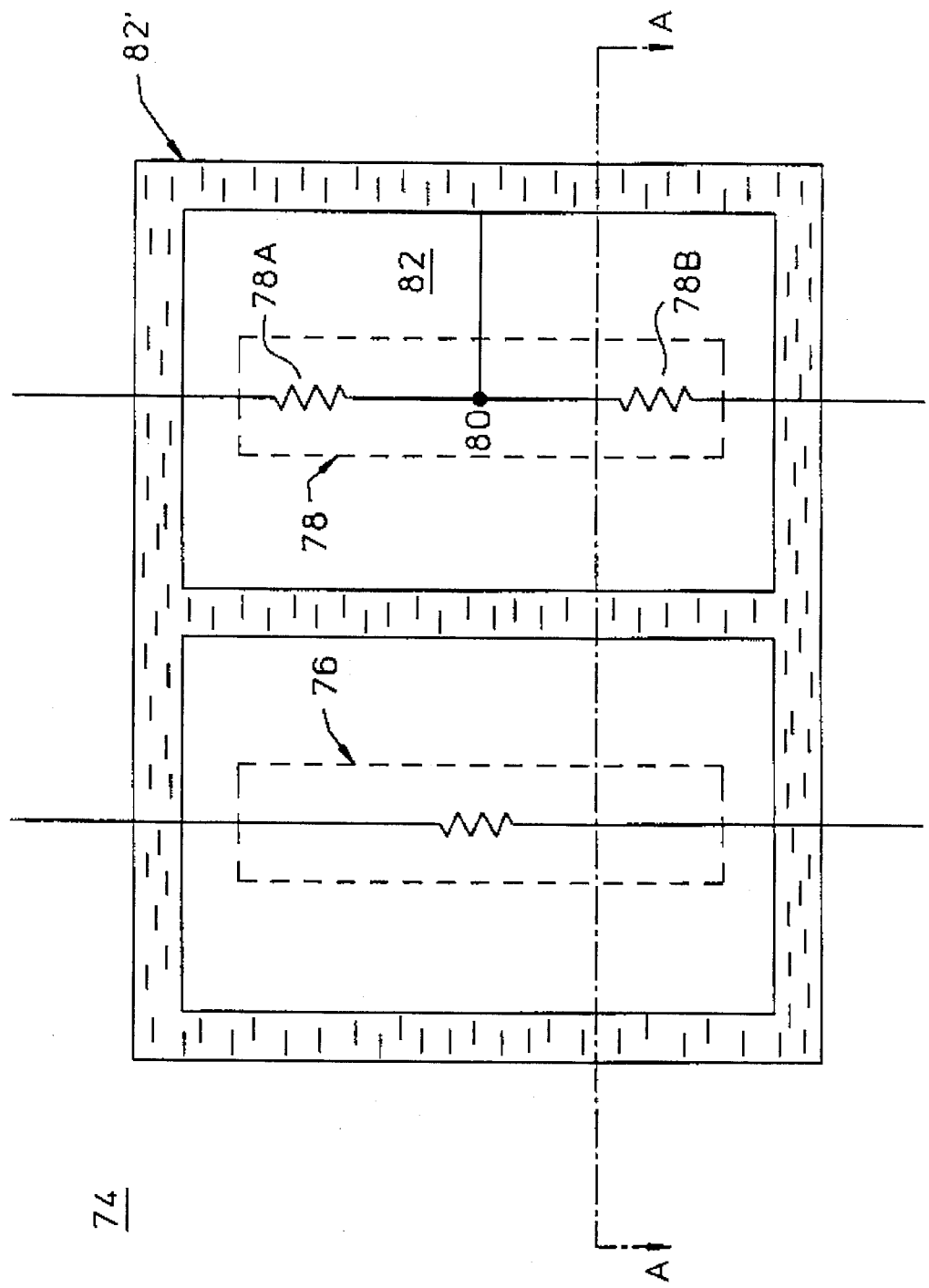
FIG. 7 is a combined schematic and physical representation showing one of the precision integrated resistor depicted in FIG. 6B.

FIG. 7 is a combined schematic and physical representation showing one of the precision integrated resistors 74A depicted in FIG. 6B. The resistors 76, 78 are seated in a shared island tub 82. The biasing resistor 78 is a voltage divider containing two split resistors 78A, 78B. A metal contact from the voltage divider node 80 to the island tub 82 is used. Optional barrier rings 82' prevent surface leakage current, provides contact to island tub 82, and evenly distributes the voltage throughout the island tub 82.

Figure 8:
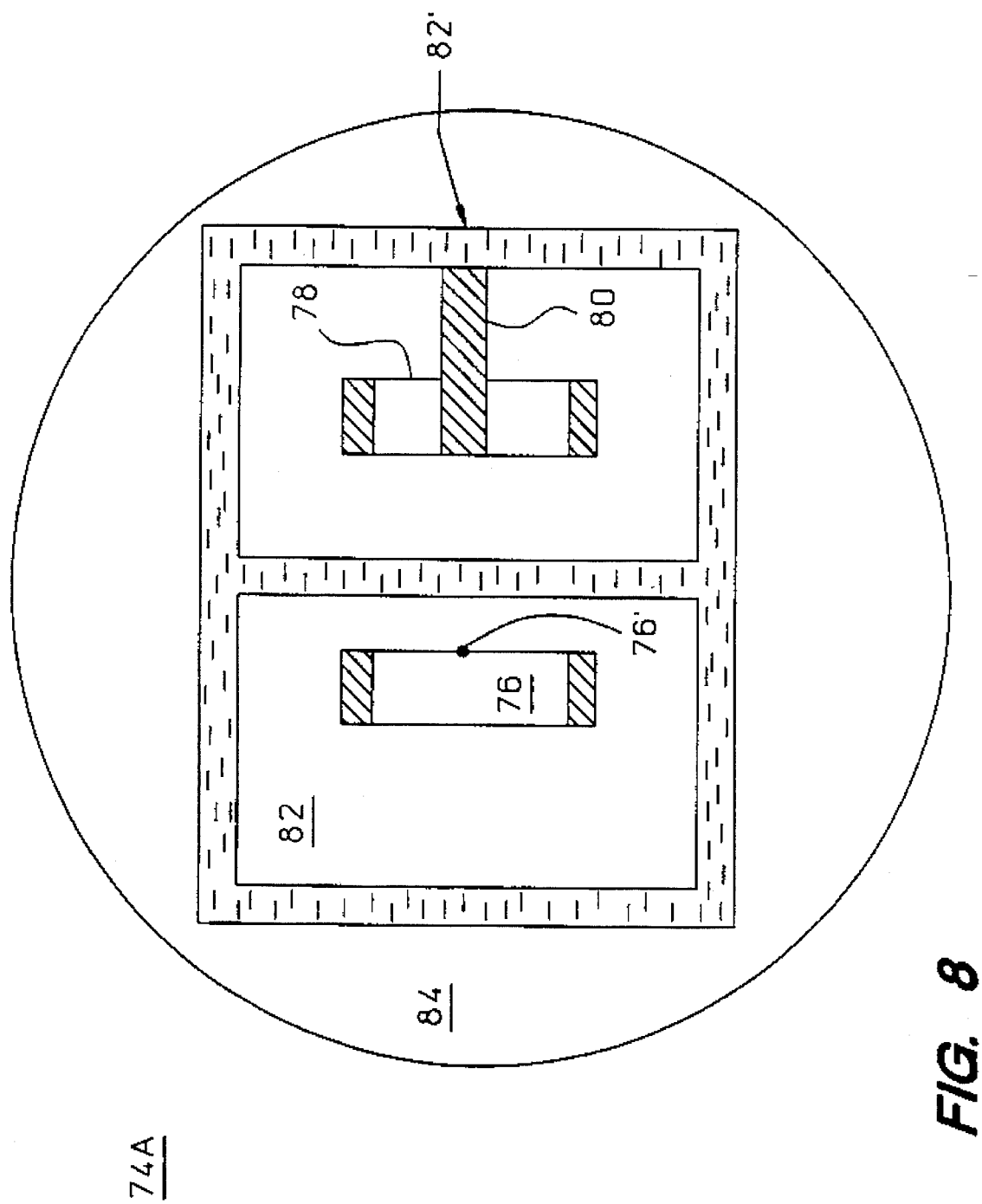
FIG. 8 is a top physical view of the precision integrated resistor depicted in FIGS. 6B and 7.

FIG. 8 shows a top level view of the layout of the precision integrated resistor 74A depicted in FIG. 6B formed within a n-type semiconductor substrate 84, such as silicon. Both the measurement and biasing resistors 76, 78 are formed within island tub 82. Each resistor is a shallow p-type diffusion region. The diffusion region of the measurement resistor 76 has uniform resistance. The voltage divider node 80 is physically and electrically connected to the shared island tub 82 through barrier ring 82'. Thus, the node 80, the midpoint 76' of the measurement resistor 76, and the island tub 82 are at the same potential. This potential has been chosen to optimize forward and reverse biasing of the measurement resistor. The precision integrated resistor can be optimized by including a buried layer region and isolation ring. The precision integrated resistor may also be formed within a p-type semiconductor substrate in a similar fashion.

Figure 9A:
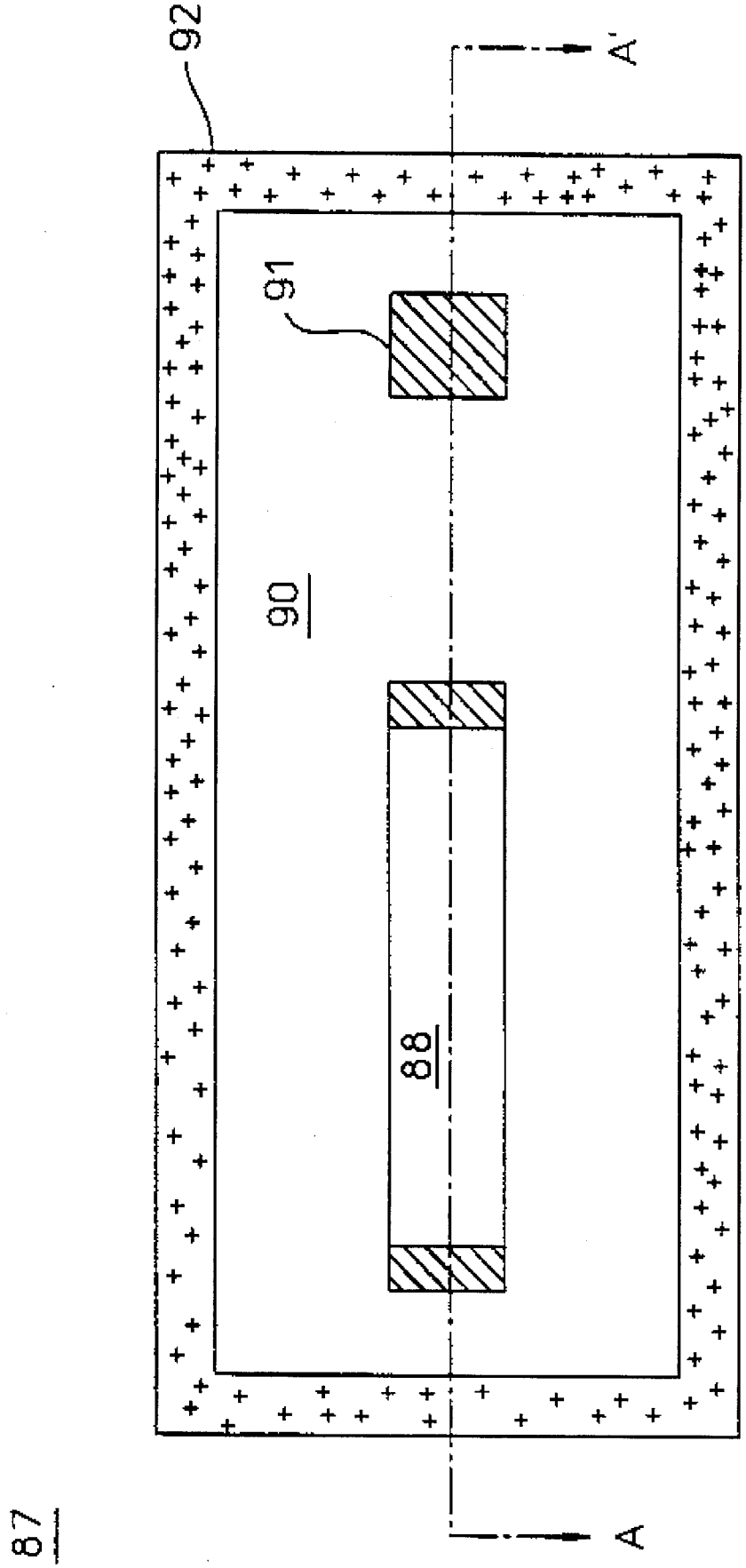
FIGS. 9A–D show different views of a prior art diffusion resistor.

FIG. 9A illustrates a prior art diffusion resistor used as a measurement resistor.

Figure 9B:
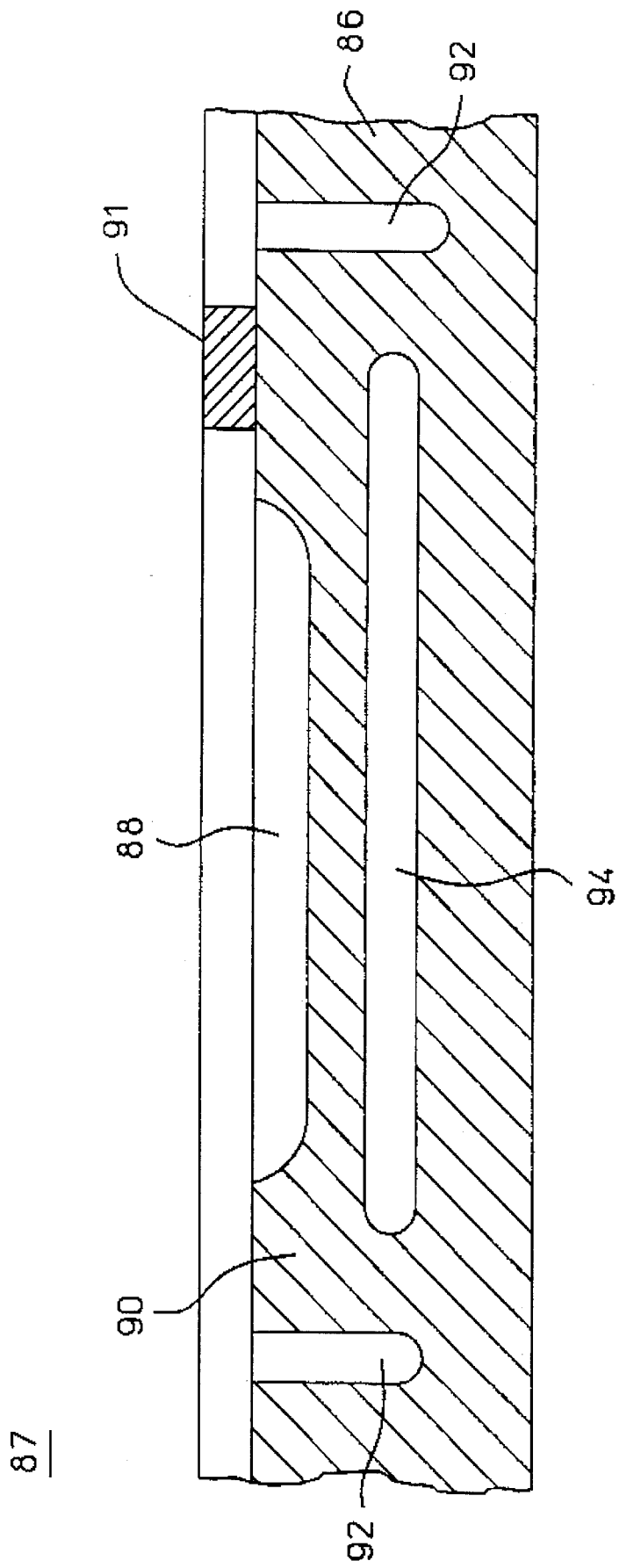

FIG. 9B shows a cross-sectional view of the prior art diffusion resistor 87 on a semiconductor substrate 86, such as silicon, along line A—A' of FIG. 9A. There is a non-linear leakage current from a p-type diffusion region 88 to an n-type island tub 90. The p-n junction between diffusion region 88 and island tub 90 is normally reverse-biased since the island tub 90 has a higher potential than that of the diffusion region 88. The potential of the island tub 90 is electrically connected to a voltage source. The leakage current increases exponentially with temperature and with the potential difference between the diffusion region 88 and the tub 90. The leakage current cannot be accounted for in design since it is unknown. Isolation ring 92 encases island tub 90 minimizing the interaction between the resistor and other elements built on the same substrate 86. Buried layer 94, embedded at the bottom of the island tub 90, reduces the parasitic leakage path from the diffusion region 88 through the island tub 90 to the substrate 86. This path forms a parasitic transistor. The buried layer of the same type of the island tub acts as a very wide base dropping the gain in the parasitic transistor and minimizing another parasitic leakage path.

Figure 9C:
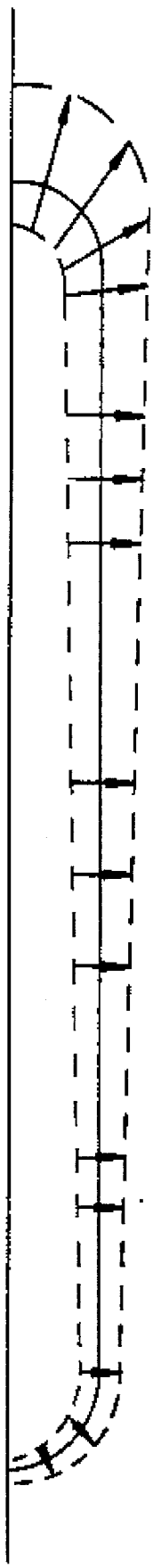

FIG. 9C pictorially illustrates the potential parasitic leakage paths in the prior art diffusion resistor 87 depicted in FIG. 9B. The number and length of the arrows indicate the relative strength while the arrowheads indicate the direction of the biasing along the resistor p-n junction between diffused region 99 and the island tub 90. The potential of the island tub 90 is biased such that the isolation p-n junction is reverse biased.

Figure 9D:
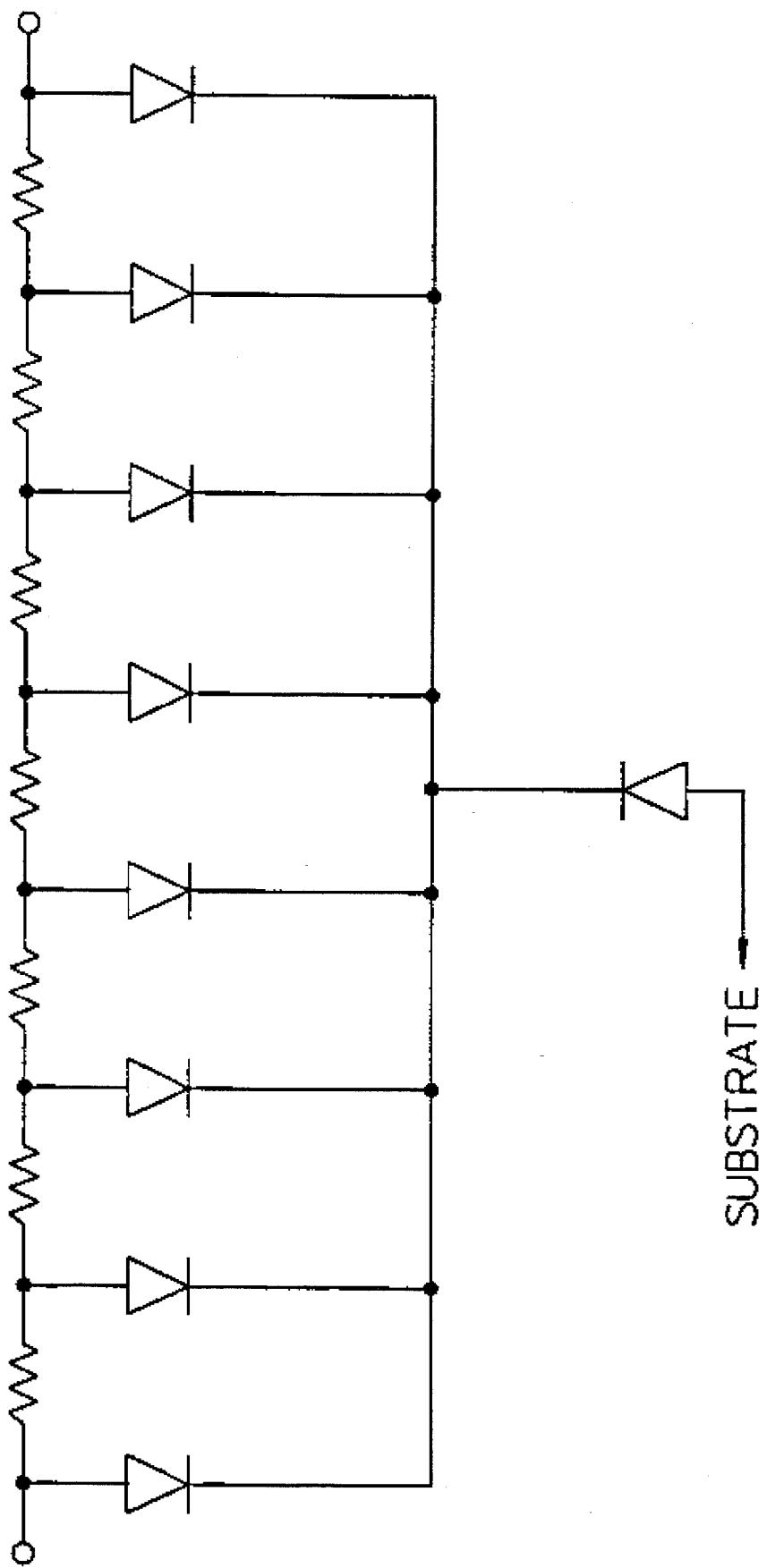

FIG. 9D is an electrical model of the parasitic leakage paths shown in FIG. 9C. The leakage current corresponds directly to the reverse biasing between the diffusion region 88 and the island tub 90. Since the resistor p-n junction is reverse biased, the prior art diffusion resistor maximizes leakage current and bidirectional current flow in the measurement resistor compounds this problem.

Figure 10:
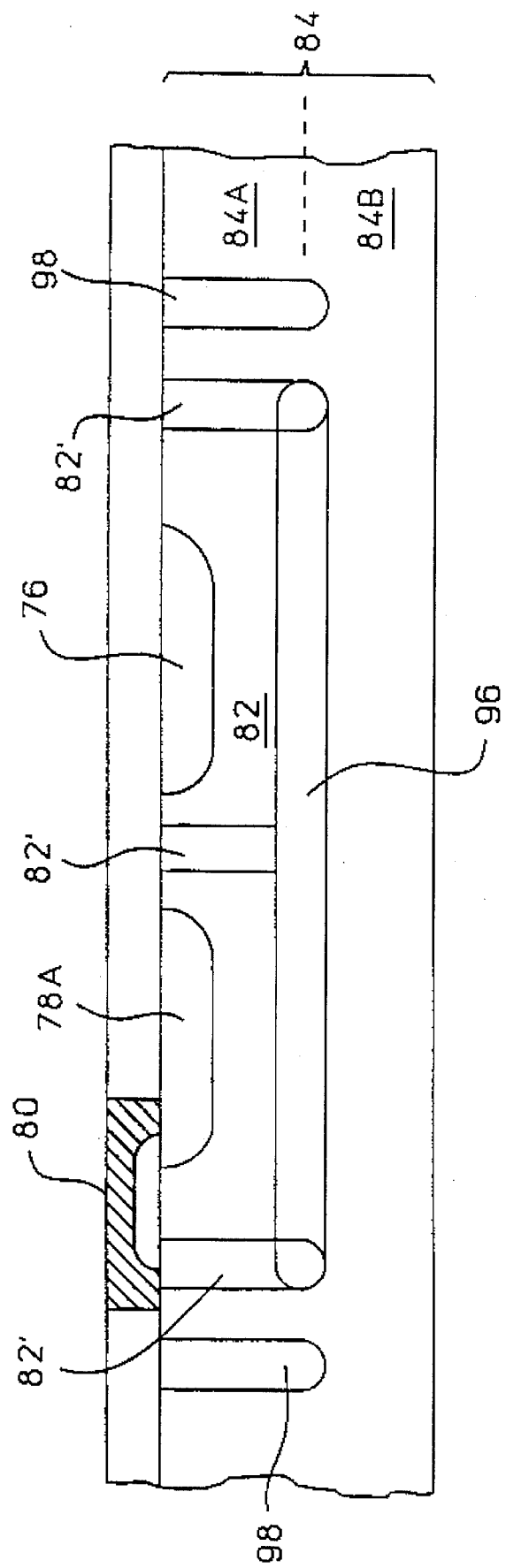
FIG. 10 shows a physical cross-sectional view along line A—A' of the precision integrated resistor depicted in FIG. 7.

FIG. 10 shows a cross-sectional view of the precision integrated resistor 74A (formed within the semiconductor substrate 84) along axis A—A' depicted in FIG. 7. The substrate 84 consists of n-epitaxial silicon 84A on top of a lightly doped p-type silicon wafer 84B. The precision integrated resistor 74A includes an n-type island tub region 82 within the substrate 84. The island tub region 82 extends from a surface of the substrate 84 to a first depth through the n-epitaxial silicon 84A. A p-type isolation ring 98 within the substrate 84 is contiguous to and encases the island tub region 82 to minimize parasitic interaction between the resistor 74 and the rest of the IC 2 on substrate 84. The isolation ring 98 extends from the surface through n-epitaxial silicon 84A to the first depth. N-type barrier rings 82', contained within island tub 82, extends from the surface to the first depth. Measuring 76 and split biasing 78A, 78B resistors are contained within the barrier rings 82', extend from the surface of the substrate to a second depth, and of p-type material. N-type buried layer 96, embedded at the bottom of island tub 82 reduces the leakage current due to a virtual parasitic transistor which exists between the diffusion region 76, island tub 82, and substrate 84. A metal contact 80 is positioned at the surface of the substrate and electrically connects the barrier rings 82' to the split biasing resistors 78A, 78B, such that a biasing voltage may be applied to the island tub 82. A resistor contact (not shown) is positioned at the surface of the substrate and at each end of measurement resistor 76.

The voltage at the voltage divider node 80 is at the same potential of the midpoint 76' of the measurement resistor 76 and electrically tied to the island tub 82. Setting the potential of the island tub 82 to the midpoint 76' of the measurement resistor 76 controls the potential difference between the measurement resistor 76 and the tub 82 thus reducing the leakage current. In the region where measurement resistor 76 has a greater potential than island tub 82, the parasitic p-n junction is partially forward biased. In the region where measurement resistor 76 is lower potential than island tub 82, the parasitic p-n junction is partially reverse biased. This biasing scheme results in known leakage currents which compensate each other in implementation.

The precision integrated resistor was implemented in HP5, a commercially available bipolar process offered by the Hewlett-Packard Company. The island tub 82 is of an n-type epitaxial silicon having a doping level on the order of $5.5 \times 10^{15}$ atoms/cc. Each of the diffusion regions 76, 78A, 78B is of p-type silicon having a doping level between $2 \times 10^{18}$ and $5 \times 10^{18}$ atoms/cc. The diffusion regions 76, 78A, 78B extend from the surface of the substrate 84 to a depth of 0.3 microns. The buried layer 96 is a 2 micron thick layer of n-type silicon having doping level of $10^{20}$ atoms/cc which is positioned 2–2.5 microns below the substrate surface 84. The barrier ring 82' is of n-type semiconductor material having a doping concentration of $10^{19}$–$10^{20}$ atoms/cc. The barrier rings 82' extends from the surface of the substrate 84 to the buried layer 96. Isolation ring 98 is of p-type material having a doping concentration of $10^{19}$ atoms/cc and extends through the substrate 84 to the first depth. Although the precision integrated resistor was implemented in a bipolar process, it can be fabricated in other semiconductor technologies, such as CMOS, as the diffusion resistors are built in a similar fashion.

The precision integrated resistor may also be fabricated adapting the basic planar process technology disclosed by Noyce (U.S. Pat. No. 2,981,877 which was issued on 25 Apr. 1961) to include at least two diffusion regions. Noyce disclosed a silicon oxide film which is thermally grown on a silicon substrate by placing it in a furnace at an elevated temperature and passing an oxidizing agent over it. The resulting silicon oxide film acts as a masking medium against the impurities which are later diffused into the substrate. Holes are produced in the silicon oxide film to allow subsequent diffusion processes to form the precision integrated resistor. These holes which are patterns of the desired resistors are produced by photolithographic techniques. Contacts and interconnects are made by similar photolithographic techniques using a conductive contact system over the oxide film to form a metallic pattern connecting the circuit elements together in the desired configuration.

Figure 11:
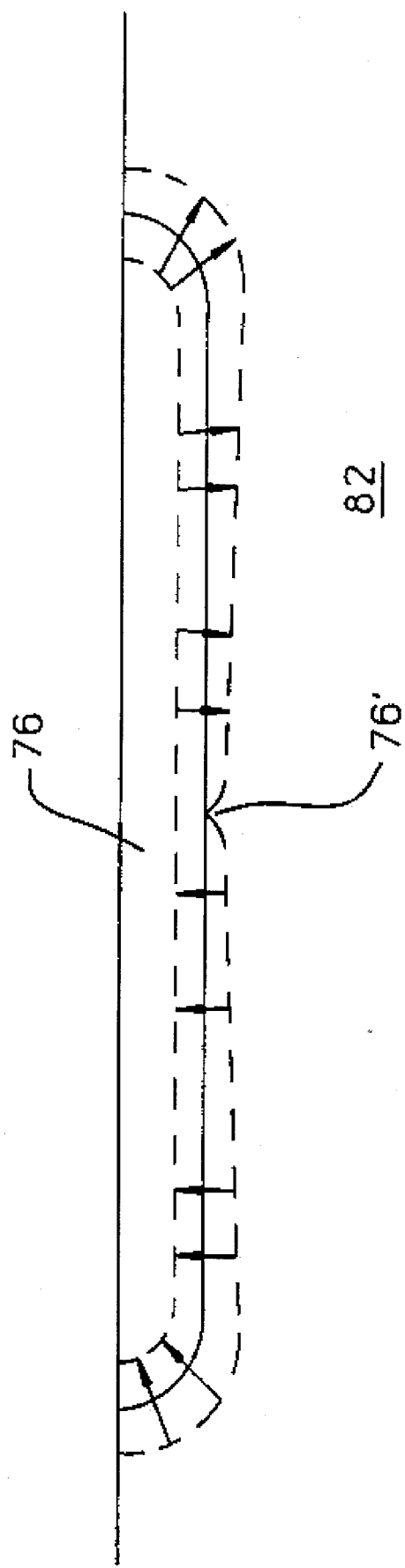
FIG. 11 shows parasitic leakage paths in the precision integrated resistor shown in FIG. 7.

FIG. 11 pictorially illustrates the parasitic leakage paths in the measurement resistor 76 of the precision integrated resistor 74 depicted in FIG. 7. The number and length of the arrows indicate the relative strength and direction of the biasing along the p-n junction between measurement resistor 76 and the island tub 82. The potential of island tub 82 is set to be equal to the midpoint 76' of measurement resistor 76. In the region where measurement resistor 76 has a greater potential than island tub 82, the parasitic p-n junction is partially forward biased. In the region where measurement resistor 76 is lower potential than island tub 82, the parasitic p-n junction is partially reverse biased. Thus, the overall leakage current is dramatically reduced by setting a potential on the island tub 82 compared to that of prior art diffusion resistors.

Figure 12:
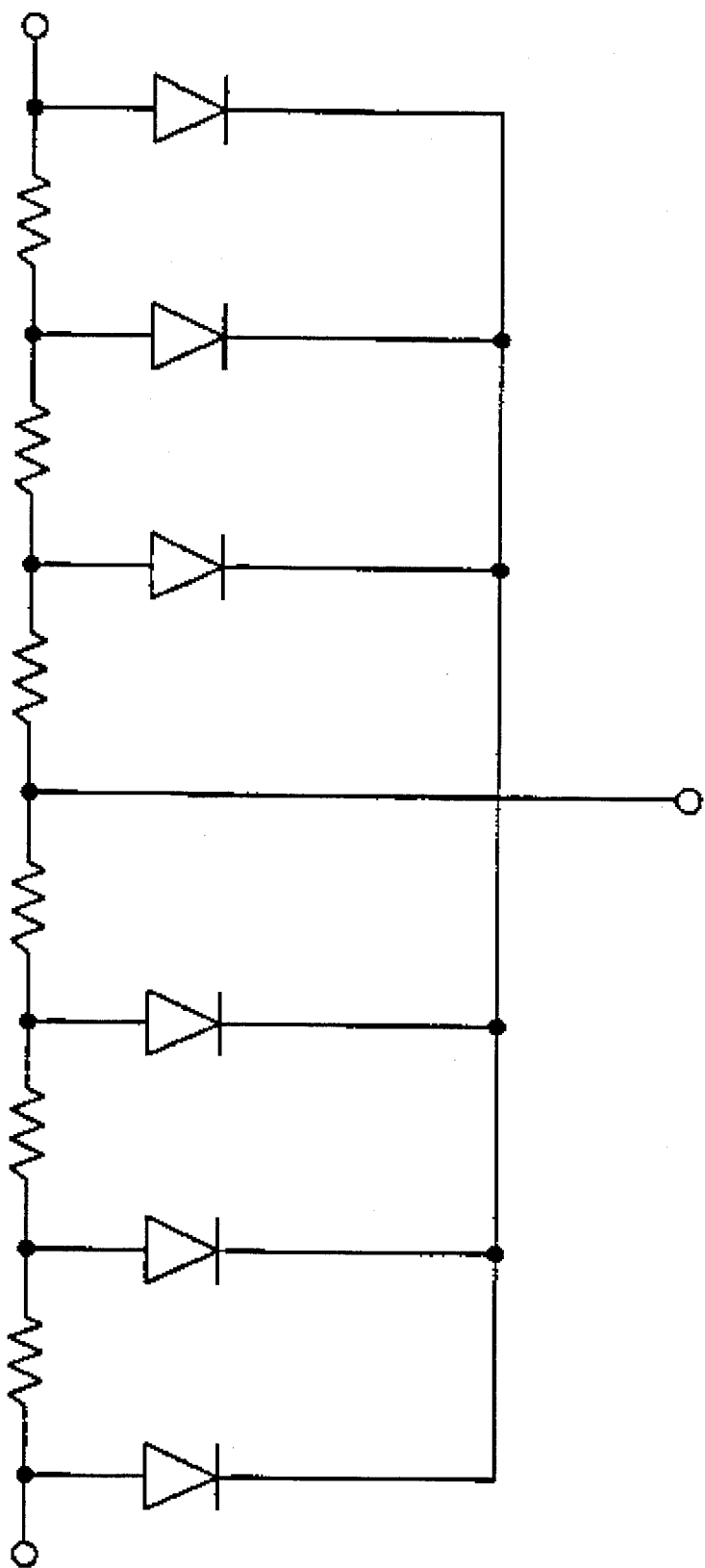
FIG. 12 is an electrical model of the parasitic leakage paths in the precision integrated resistor depicted in FIG. 7.

FIG. 12 is an electrical model of the parasitic leakage paths in the measurement resistor 76 of the precision integrated resistor 74 depicted in FIG. 7. Since the island tub 82 voltage is set, the parasitic leakage from the measurement resistor 76 to the island tub 82 is reduced. When the island tub 82 voltage matches the voltage along the measurement resistor 76, there is no leakage current because there is no potential difference.

Figure 13:
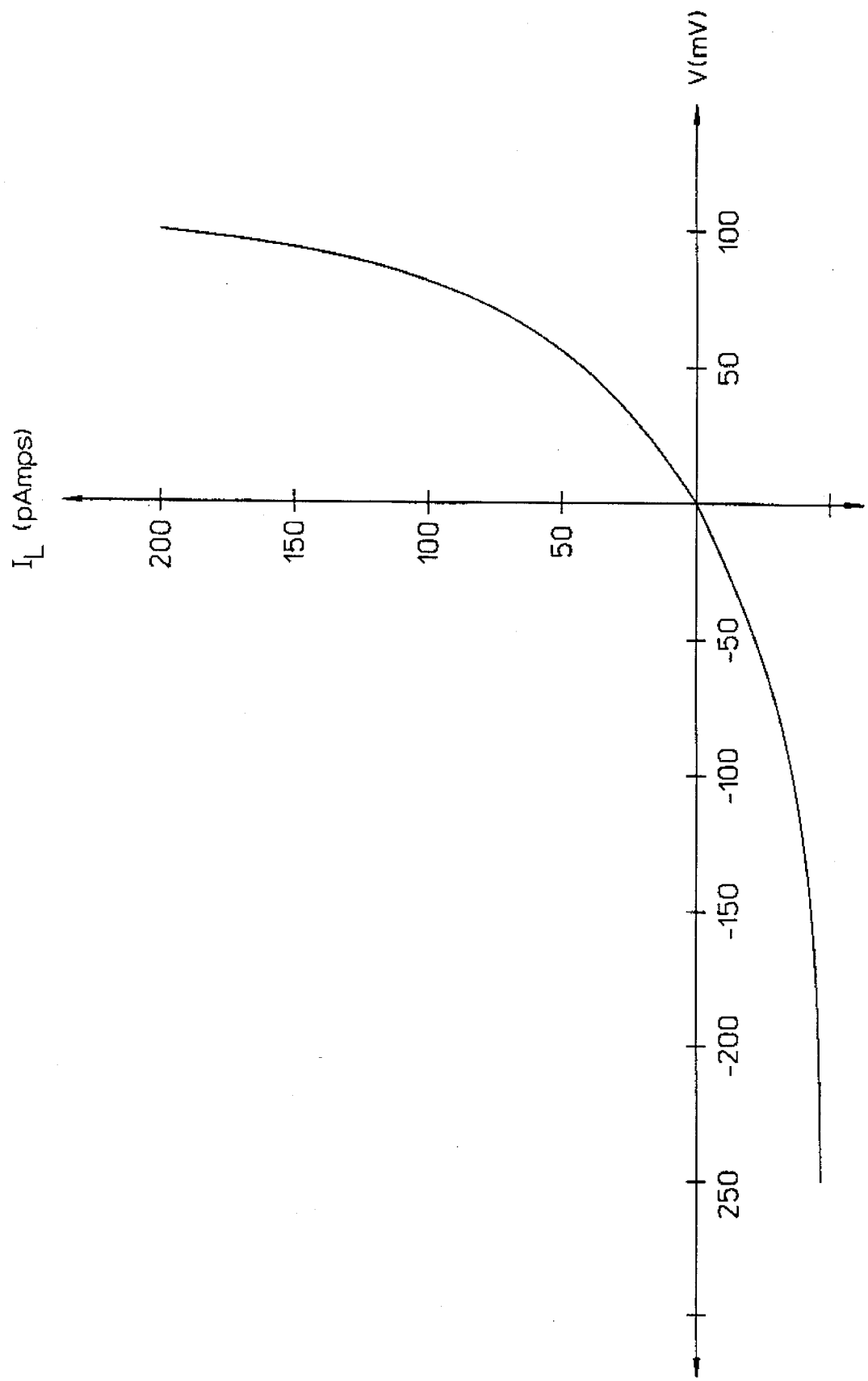
FIG. 13 shows the operating region at 75° C. of the leakage currents of the diffusion resistor shown in FIG. 9A.

FIG. 13 shows the operating region of the leakage current of the prior art diffusion resistor 88 shown in FIG. 9A at 75° C. These resistors 88 are generally reverse biased with respect to the island tub 90. A reverse-biasing as small as 200 mV across the diffusion resistor 88 can introduce an error on the order of several hundred picoamperes. At higher sensitivity ranges where nanoamperes are measured, this is a significant error.

Figure 14:
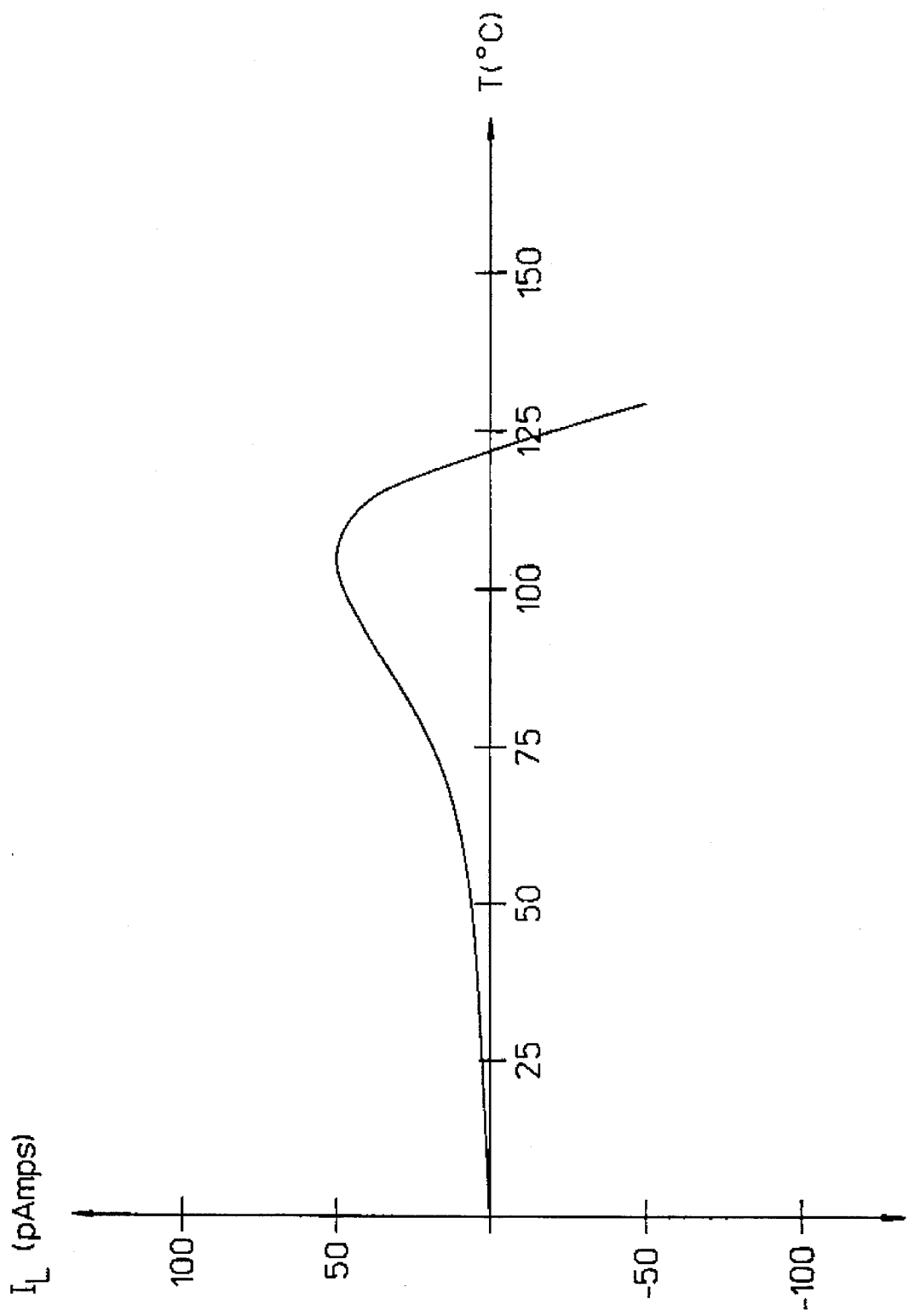
FIG. 14 shows the net leakage current over temperature of the precision integrated resistor shown in FIG. 7 when the reverse and forward biasing voltages are equal at 100 mV.

FIG. 14 shows the operating region of the leakage current with respect to temperature of the precision integrated resistor 72 shown in FIG. 6A when the reverse and forward biasing are equal at 100 mV. The overall leakage current from the measurement resistor 54 to the island tub 82 is dramatically reduced compared to that of the prior art.

Leakage currents may be decreased and the linearity of each precision integrated resistor may be improved by limiting maximum biasing voltage to small values and using the resistors in series. In this embodiment, each measurement range 26, 28, 30 contains five precision integrated resistors in series. The maximum voltage drop across each of the current measurement ranges is 1 volt. The values of the precision integrated resistors 74A–E are chosen to keep the maximum biasing voltage from the measurement resistor 76 to the island tub 82 within 100 mV. Thus, the maximum voltage drop across the parasitic leakage path between the diffusion region 76 and the island tub 82 is 100 milliVolts. At 75° C., the net leakage current is on the order of 25 picoamperes for maximum voltage drop. This will not interfere with current readings in the nanoampere range.

Figure 15:
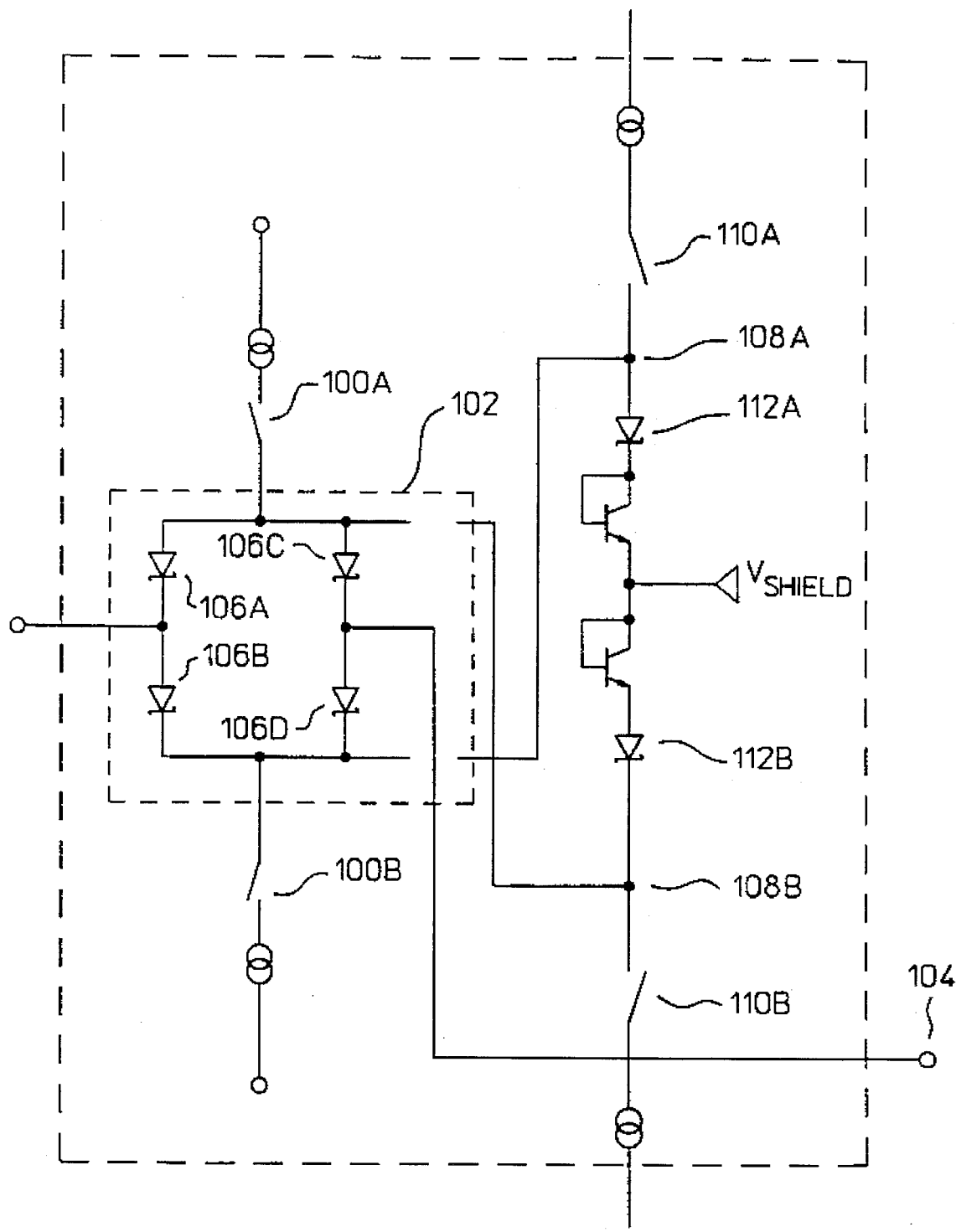
FIG. 15 is a circuit model of one of the low-leakage diode bridges depicted in FIG. 5.

FIG. 15 is a circuit model of low-leakage diode switches 66, 68, 70 depicted in FIG. 5. When the diode switch 66, 68, 70 is off, enabling switches 100A, 100B are open while switches 110A and 110B are closed. The switch diodes 106A–D are reverse biased such that the voltage drop across each of the switch diodes 106C, 106D is equal. By Kirchhoff's current law, the current leaking in and out of output node 104 is equal. The output node 104 acts as a high impedance node looking back into the circuit. The diode switches perform a single position-single pole function.

In this embodiment, output node 104 electrically tracks $V_{shield}$ which is received from the buffer amplifier 32. Enabling nodes 108A, 108B are restricted to a voltage range between ($V_{shield}$−V) and ($V_{shield}$+V) volts inclusively by guard diodes 112A, 112B. The reverse biasing, V, of each of the diodes 106A–D is biased about 1 volt to keep the diode leakage current at a minimum. Functionally, the IC 2 uses low-leakage diode switches for pass-through 22 and impedance 40 switches instead of discrete relays to change between the current measurement ranges. Leakage current, on the order of nanoamperes from diode switches 22, 40 that are open or disabled, is dramatically reduced by reverse biasing the diodes 106A–D about the output node 104 by an equal amount so that the summed current at the output node 104 is almost zero.

Figure 16:
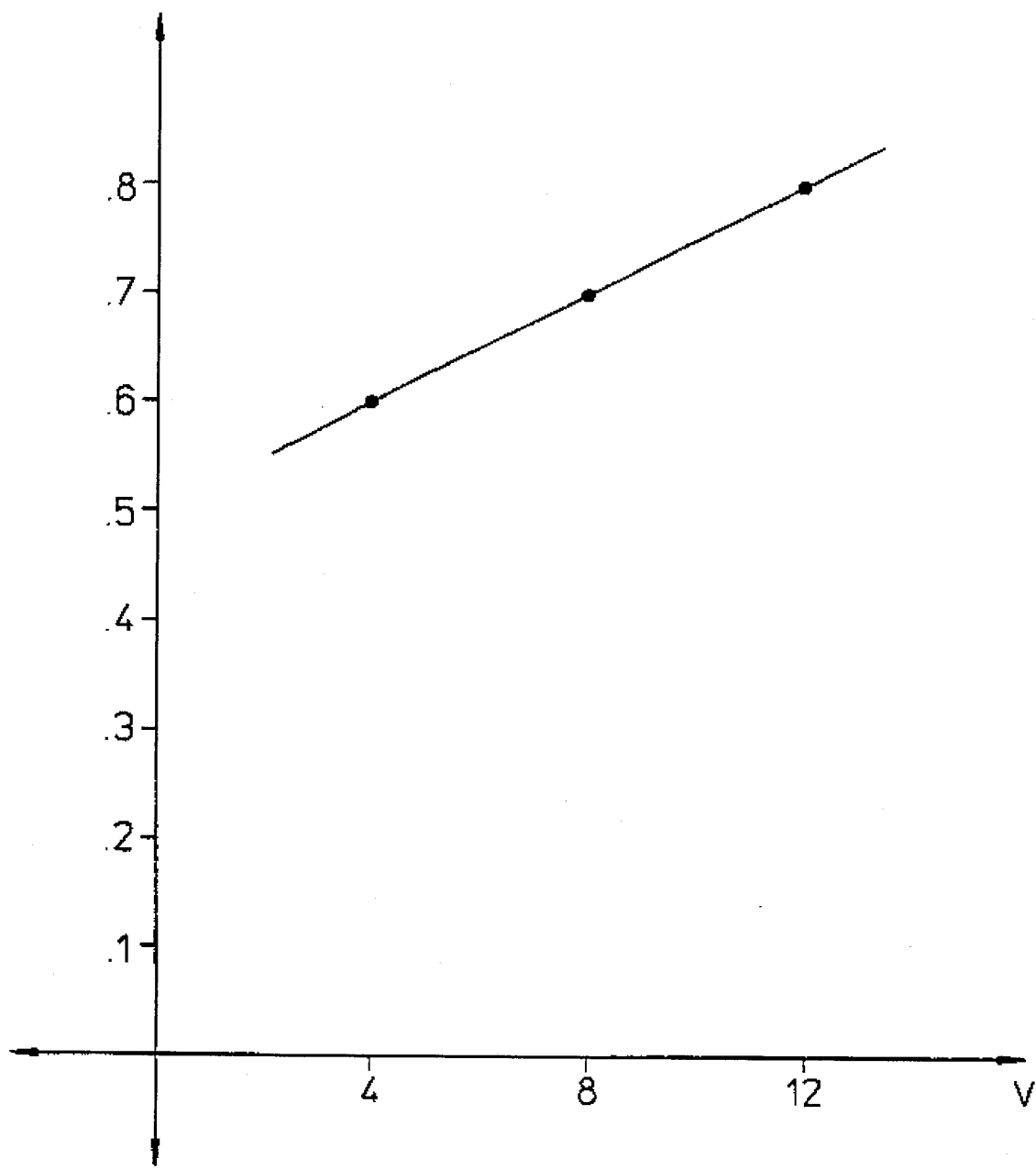
FIG. 16 shows the operating region of the leakage current of a prior art diode bridge at elevated temperatures.

FIG. 16 shows the operating region of the leakage current of a disabled prior art diode switch. The resulting leakage current is in the nanoampere range which drastically affects the accuracy of current readings in the nanoampere range.

Figure 17:
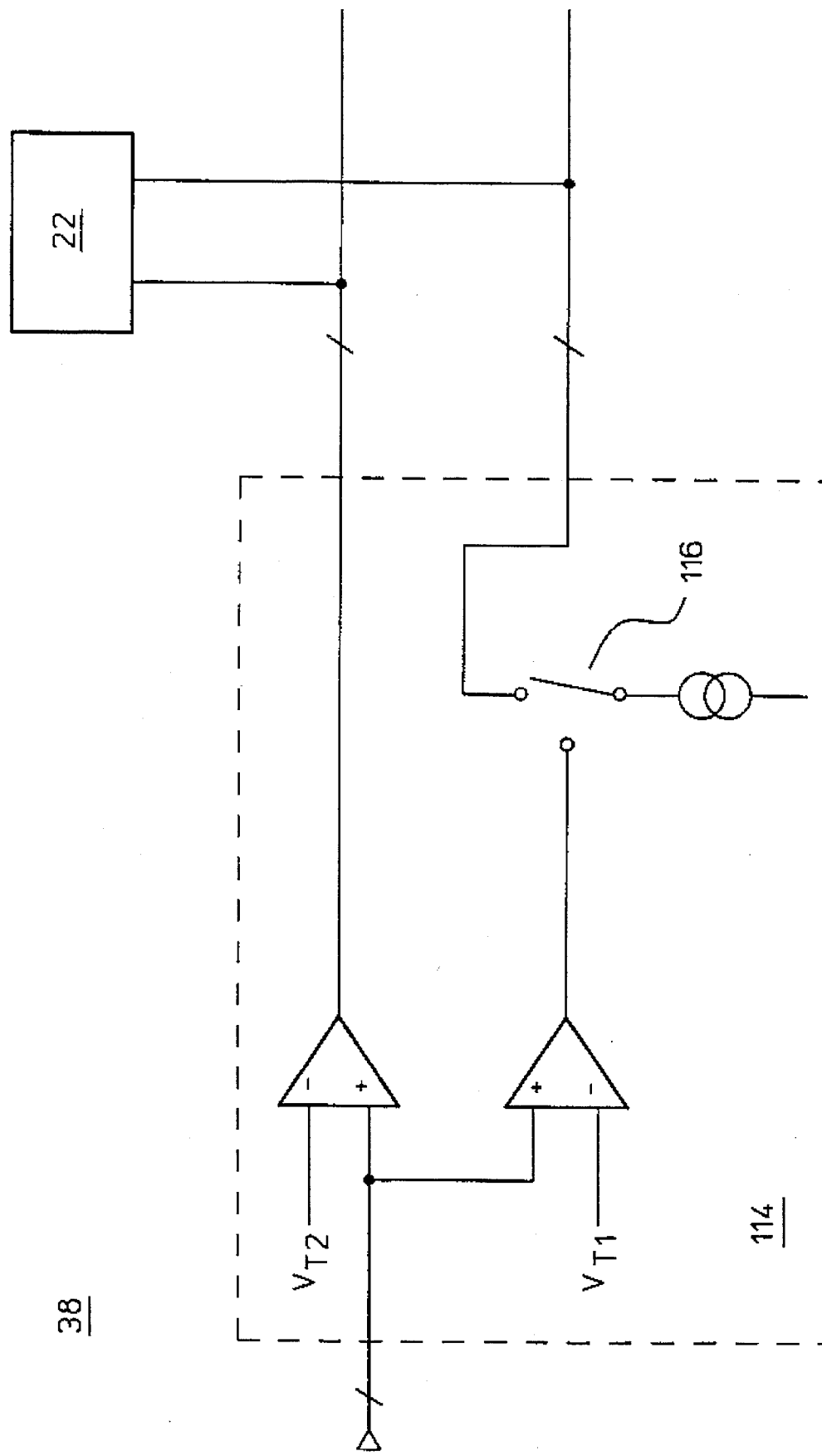
FIG. 17 is a portion of the functional block diagram of the spike suppression control circuit for controlling the switches depicted in FIG. 3.

FIG. 17 shows a portion of the functional block diagram of the spike controller 38 depicted in FIG. 3. External control signals, derived from a clock signal, are processed by switch controller 114, 114', 114" which selects and activates the desired current measurement range 26, 28, 30, respectively. Each controller 114, 114', 114" compares a control signal with a first threshold voltage $V_{T1}$ at the beginning of a clock cycle. When the first threshold voltage $V_{T1}$ is crossed, internal switch 116, powered by an internal current source opens. In response to the internal switch 116 opening, the guard diodes in the pass-through 22, impedance 40, and biasing 66, 68, 70 switches affecting all of the current measurement range 26, 28, 30 are turned off. The same control signal is then compared with a second threshold voltage $V_{T2}$. When the control signal is greater than the second voltage $V_{T2}$, the pass-through 22, impedance 40, and biasing 66, 68, 70 switches of the desired current measurement range 26, 28, 30 have completed their activation or deactivation. The spike control function during changes between current measurement ranges allows the "on" diode switch to ramp down to the off position and another "off" diode switch to ramp up to the on position. During the ramping operation, the protection switch 24 is turned on to reduce the time constant of the driver 18. Although the ramp time can be designed into the IC 2, in the present embodiment, the ramp time is selected by the user.

Figure 18:
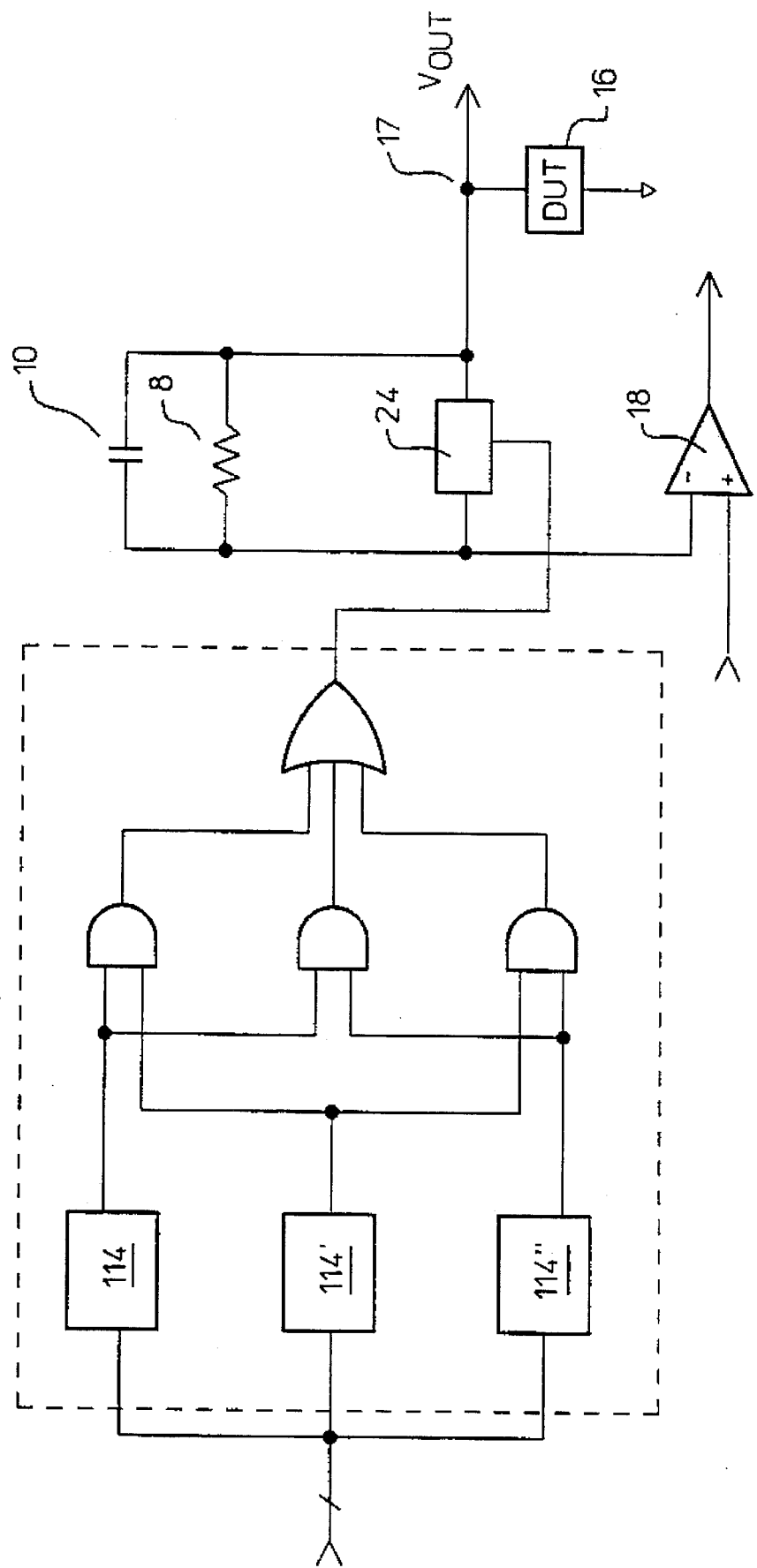
FIG. 18 is a portion of the functional logic block diagram for spike suppression control circuit for controlling the spike switch depicted in FIG. 3.

FIG. 18 shows a portion of the functional block diagram of the spike controller 38 depicted in FIG. 3. The negative feedback time constant of the driver 18 is large in order to accommodate large variations in load capacitance from the DUT 16. Switch controllers 114, 114', 114" enable each of the current measurement ranges 26, 28, 30, respectively. A spike suppression switch 24, such as a single pole-single throw switch, is placed in the negative feedback path of the input driver 18 to safeguard the DUT 16 from voltage spikes that occur when the current measurement ranges 26, 28, 30 are changing. When the current measurement ranges 26, 28, 30 change, two control signals for two switches are simultaneously active. When both control signals are greater than the first threshold voltage, the spike suppression switch 24 closes allowing the driver 18 to react faster. This reduces the voltage spike seen on the pin 17 of the DUT 16 by a factor of 10, such that the sensitive circuitry on the DUT 16 is protected from voltage spikes.

The time constant necessary to maintain stability during test in the IC 2 is slow enough that voltage spikes may affect the DUT 16 when the current measurement ranges 26, 28, 30 are changed. To minimize the effect of voltage spikes, spike suppression is introduced into the IC 2. A spike suppression signal is received from the spike controller 38 allowing the diode switch 24 to dominate the time constant of the input driver 18 to provide faster charging of the capacitor 10. Stability and precision are not design concerns during switching of the measurement ranges. The smaller time constant accelerates the charging of the feedback capacitor. Upon the end of the ramping operation, the diode switch 24 opens allowing the RC circuit in the negative feedback path of input driver 18 to dominate.

Figure 19:
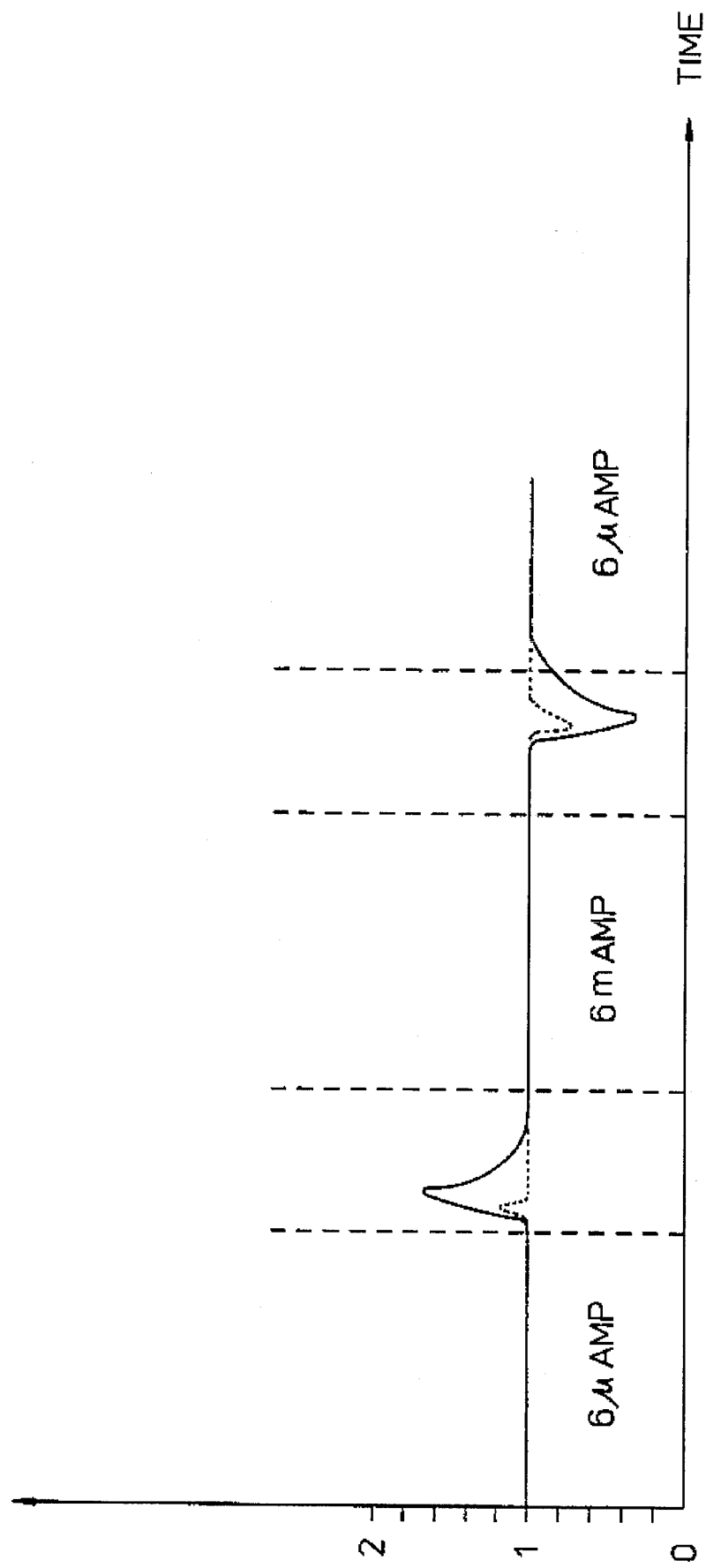
FIG. 19 shows the voltage on a pin of the DUT when the spike control circuit shown in FIG. 3 is disabled and enabled.

FIG. 19 shows the voltage on a pin of the DUT when the spike control circuit shown in FIG. 3 is disabled and enabled. The solid line indicates the circuit operation when the spike control circuit is disabled. This voltage spike may be large enough to jeopardize the sensitive circuitry on the DUT itself. The dashed line indicates the circuit operation when the spike control circuit is enabled. The spike suppression switch 24 in the negative feedback path of the input driver 18 overrides the feedback circuit during switching to reduce the spike to a safer level. This minimizes the effect of the voltage spikes on the DUT 16 as the IC 2 steps through the current measurement ranges 26, 28, 30.

We claim:

1. An integrated circuit for measurement of current by applying a test voltage resulting in an unknown current in a pin of a device under test upon receiving one of two logic states, the integrated circuit comprising:

a driver, connected to the applied test voltage, having a driver output;

a pass-through switch, connecting to the driver output;

a low leakage diode switch having switch diodes, connected to the the pass-through switch, having a switch output between the switch diodes, receiving the logic states such that the low leakage diode switch closes after receiving the first logic states and the low leakage diode switch opens after receiving the second logic states and the switch diodes are reverse biased to result in a known diode leakage current;

a measurement resistor connected to the switch output, having a scaling factor, receiving a guard signal; and mirroring means, connected to the measurement resistor, receiving the guard signal, for producing a mirror current proportional to the unknown current by the scaling factor, such that the unknown current is determined from the mirror current and the scaling factor;

wherein the guard signal limits the reverse biasing of the switch diodes.

2. An integrated circuit for measurement of current as recited in claim 1, wherein the switch diodes are symmetrically reverse-biased after the second logic state is received.

3. An integrated circuit for measurement of current as recited in claim 2, wherein the switch diodes are symmetrically reverse-biased about the applied voltage.

4. An integrated circuit for measurement of current as recited in claim 3, wherein the switch diodes are symmetrically reverse-biased by 0 to 1 volts inclusively such that the diode leakage current is constrained.

* * * * *